(12) United States Patent
Xia et al.

(10) Patent No.: US 10,490,728 B2
(45) Date of Patent: Nov. 26, 2019

(54) FABRICATION METHODS FOR A PIEZOELECTRIC MICRO-ELECTROMECHANICAL SYSTEM (MEMS)

(71) Applicant: GLOBALFOUNDRIES Singapore Pte. Ltd., Singapore (SG)

(72) Inventors: Jia Jie Xia, Singapore (SG); Minu Prabhachandran Nair, Singapore (SG); Zouhair Sbiaa, Singapore (SG); Ramachandramurthy Pradeep Yelehanka, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 371 days.

(21) Appl. No.: 15/256,727

(22) Filed: Sep. 5, 2016

(65) Prior Publication Data

US 2017/0301853 A1    Oct. 19, 2017

Related U.S. Application Data

(60) Provisional application No. 62/322,815, filed on Apr. 15, 2016.

(51) Int. Cl.
 *H01L 41/083* (2006.01)
 *H01L 41/29* (2013.01)
  (Continued)

(52) U.S. Cl.
 CPC ........ *H01L 41/083* (2013.01); *H01L 41/0471* (2013.01); *H01L 41/0474* (2013.01);
  (Continued)

(58) Field of Classification Search
 CPC ............ H01L 41/0471; H01L 41/0474; H01L 41/0477; H01L 41/083; H01L 41/27;
  (Continued)

(56) References Cited

U.S. PATENT DOCUMENTS

| | | | | |
|---|---|---|---|---|
| 5,692,279 | A | * | 12/1997 | Mang ...................... Y10T 29/42 29/25.35 |
| 2008/0169885 | A1 | * | 7/2008 | Ueda ....................... Y10T 29/42 333/187 |

(Continued)

FOREIGN PATENT DOCUMENTS

| | | |
|---|---|---|
| CN | 1148291 A | 4/1997 |
| JP | 2008244135 A * | 10/2008 |
| WO | 2012148712 A1 | 11/2012 |
| WO | 2015171224 A1 | 11/2015 |

OTHER PUBLICATIONS

Chinese Patent Office, Office Action received in Chinese Patent Application No. 201710239774.3 dated May 21, 2019, and English translation thereof.

*Primary Examiner* — A. Dexter Tugbang
(74) *Attorney, Agent, or Firm* — Thompson Hine LLP

(57) ABSTRACT

Microelectromechanical System (MEMS) devices and related fabrication methods. A piezoelectric stack is formed on a substrate and is separated from the substrate by a dielectric layer. The piezoelectric stack is formed that includes first and second piezoelectric layers with a first electrode below the first piezoelectric layer, as well as a contact pad and a second electrode between the first and second piezoelectric layers. A first contact is formed that extends through the piezoelectric layers and contact pad to the first electrode. A second contact is formed that extends through the second piezoelectric layer to the second electrode. The contact pad prevents an interface to form between the first and second piezoelectric layers in the contact (Continued)

opening, thus preventing corrosion of the piezoelectric layers during contact formation process.

14 Claims, 19 Drawing Sheets

(51) Int. Cl.
    *H01L 41/047*     (2006.01)
    *H01L 41/27*     (2013.01)
    *H01L 41/293*     (2013.01)

(52) U.S. Cl.
    CPC .......... *H01L 41/0477* (2013.01); *H01L 41/27* (2013.01); *H01L 41/29* (2013.01); *H01L 41/293* (2013.01); *Y10T 29/42* (2015.01); *Y10T 29/49165* (2015.01)

(58) Field of Classification Search
    CPC ....... H01L 41/29; H01L 41/293; Y10T 29/42; Y10T 29/49165
    See application file for complete search history.

(56) References Cited

U.S. PATENT DOCUMENTS

| | | | |
|---|---|---|---|
| 2010/0045145 A1* | 2/2010 | Tsuda | Y10T 29/42 310/365 |
| 2011/0277286 A1* | 11/2011 | Zhang | Y10T 29/42 29/25.35 |
| 2012/0216378 A1* | 8/2012 | Emley | H01L 41/293 29/25.35 |

* cited by examiner

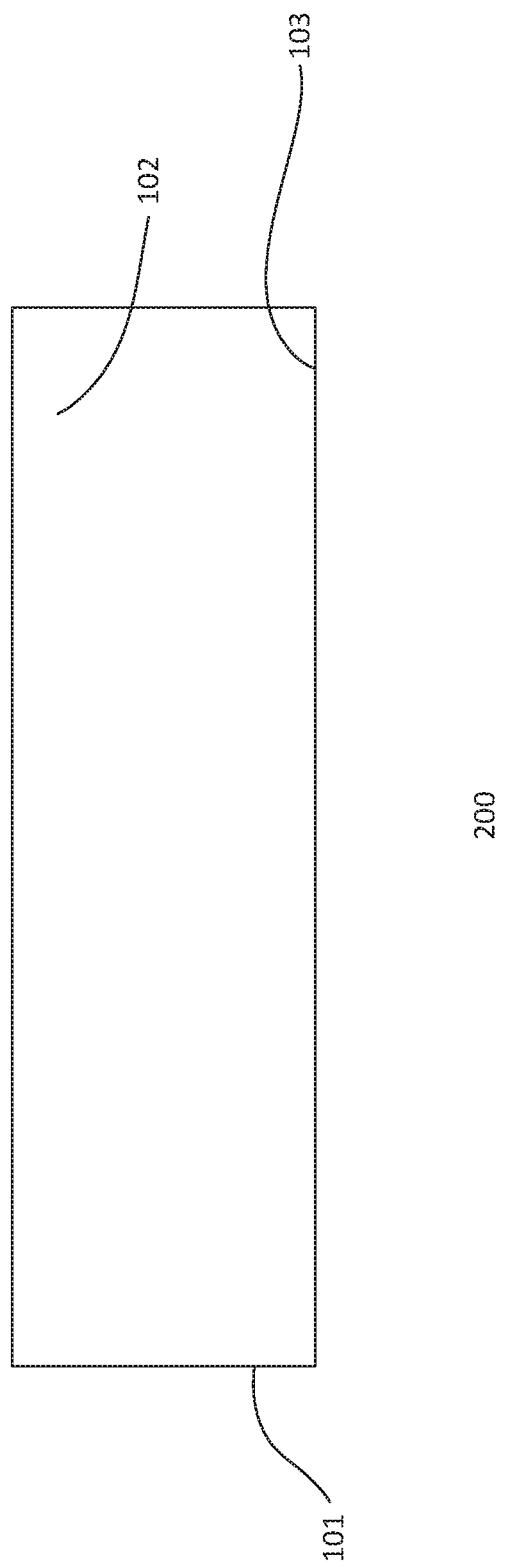

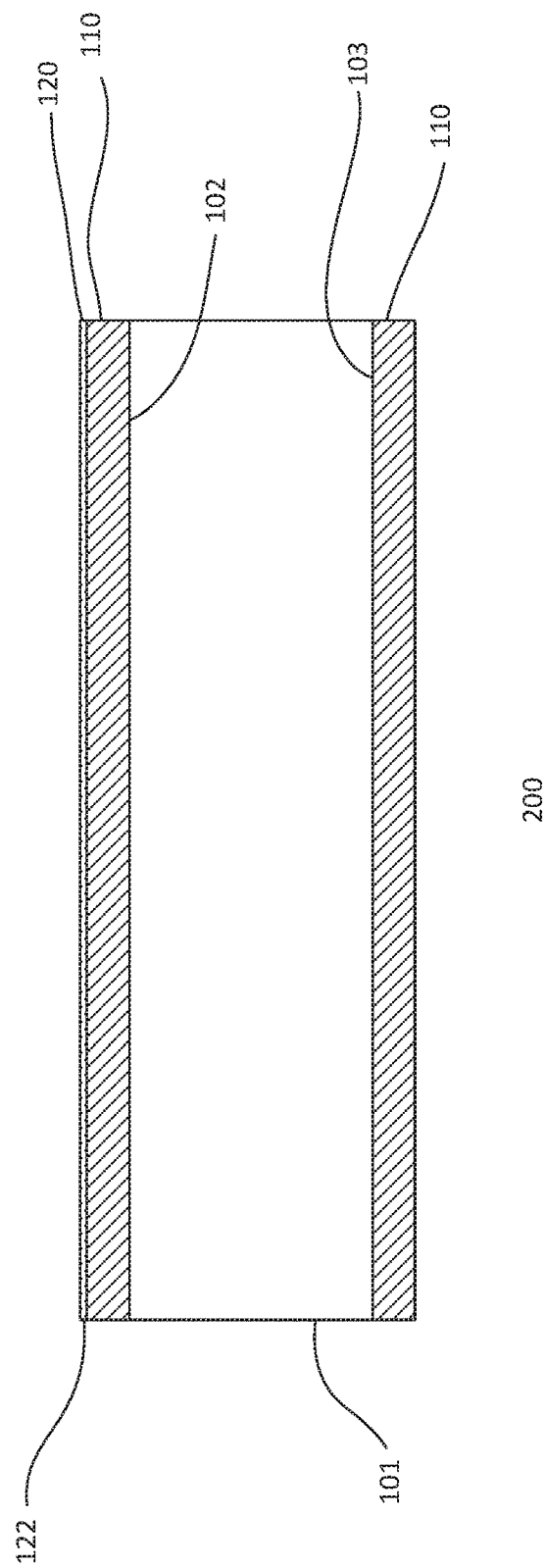

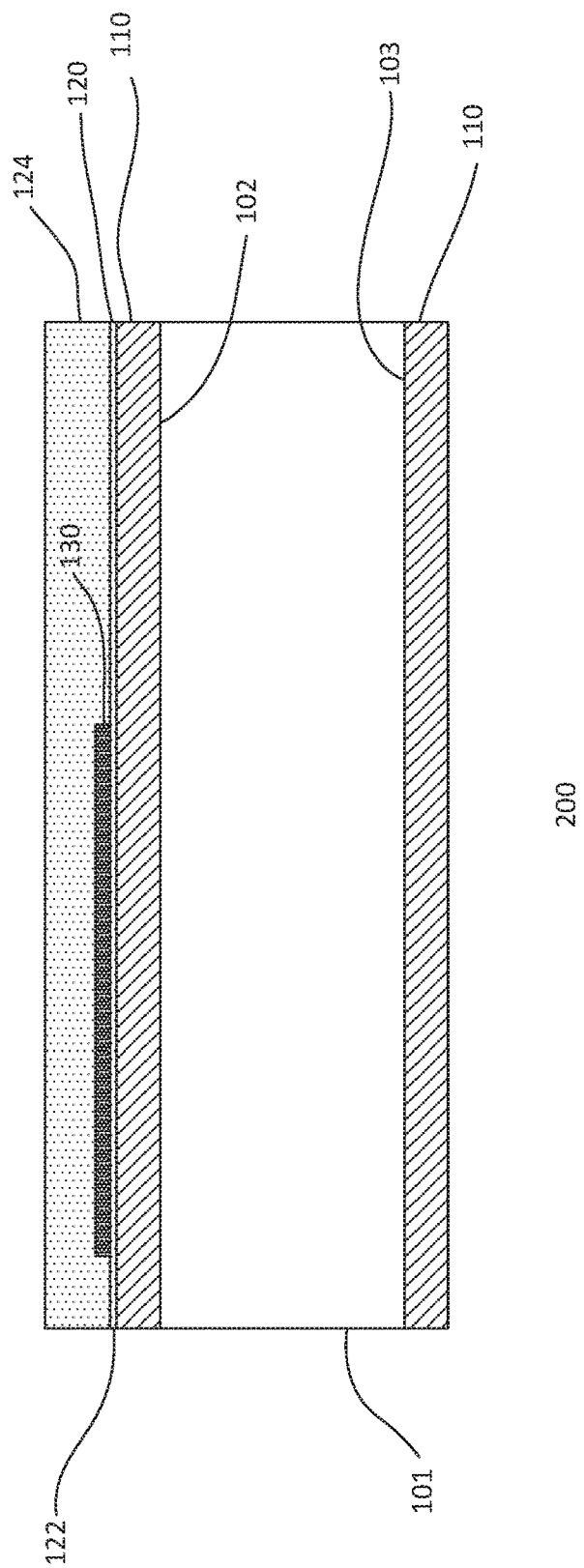

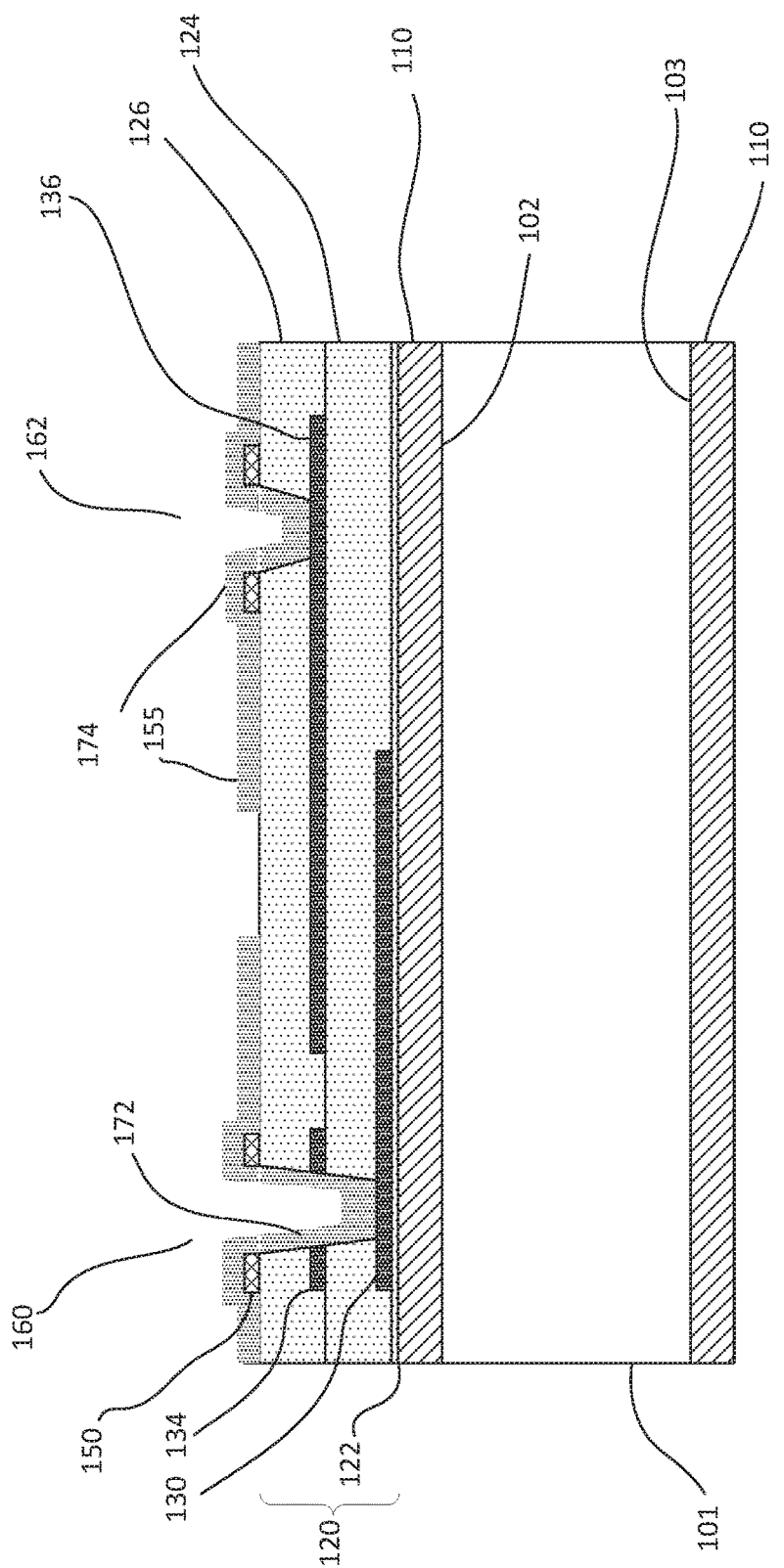

FABRICATION METHODS FOR A PIEZOELECTRIC MICRO-ELECTROMECHANICAL SYSTEM (MEMS)

CROSS-REFERENCE TO RELATED APPLICATION

This application claims the benefit of U.S. Provisional Application Ser. No. 62/322,815 filed on Apr. 15, 2016, which is herein incorporated by reference in its entirety for all purposes.

BACKGROUND

Piezoelectric stack, such as Aluminum nitride (AlN) based piezoelectric stack, has gained popularity in recent years as a trend for next generation Microelectromechanical Systems (MEMS), including Piezoelectric Micromachined Ultrasonic Transducers (PMUT), inertial sensor, resonator, radio frequency (RF) filter, etc. Multi-layer AlN provides for good diaphragm/cantilever flatness control and offers more signal output. However, there is a need for a process that allows structures to be formed on the multi-layer piezoelectric stack without damaging the interface between the piezoelectric layers

SUMMARY

Embodiments of the present disclosure generally relate to semiconductor device and method for forming a semiconductor device. In one embodiment, a method for forming a device is disclosed. The method includes providing a substrate having first and second major surfaces. A dielectric layer is formed on at least the first major surface of the substrate. A piezoelectric stack is formed on the substrate. The piezoelectric stack includes a patterned first bottom electrode layer having a first electrode on the first major surface of the substrate, a first piezoelectric layer on the patterned first electrode layer, a patterned second bottom electrode layer on the first piezoelectric layer which includes an electrode pad and a second electrode, and a second piezoelectric layer on the first piezoelectric layer and the patterned second electrode layer. First and second contacts are formed in the piezoelectric stack. The first contact extends through the first piezoelectric layer and is electrically coupled to the first electrode. The first contact is surrounded by the electrode pad between the first and second piezoelectric layers. The second contact extends through the second piezoelectric layer and is electrically coupled to the second electrode.

In another embodiment, a Microelectromechanical System (MEMS) device is disclosed. The device includes a substrate having first and second major surfaces with a dielectric layer on at least the first major surface of the substrate. A piezoelectric stack on the substrate includes a patterned first bottom electrode layer with a first electrode on the first major surface of the substrate, a first piezoelectric layer on the patterned first electrode layer, a patterned second bottom electrode layer on the first piezoelectric layer which includes an electrode pad and a second electrode, and a second piezoelectric layer on the first piezoelectric layer and the patterned second electrode layer. The device further includes first and second contacts in the piezoelectric stack. The first contact extends through the first piezoelectric layer and is electrically coupled to the first electrode. The first contact is surrounded by the electrode pad between the first and second piezoelectric layers. The second contact extends through the second piezoelectric layer and is electrically coupled to the second electrode.

In yet another embodiment a method for forming a device is disclosed. The method includes providing a substrate having first and second major surfaces. A dielectric layer is formed on at least the first major surface of the substrate. A piezoelectric stack is formed on the substrate which includes a patterned first bottom electrode layer having a first electrode, a first piezoelectric layer on the patterned first electrode layer, a patterned second bottom electrode layer on the first piezoelectric layer which includes an electrode pad and a second electrode, and a second piezoelectric layer on the first piezoelectric layer and the patterned second electrode layer. First and second contacts are formed in the piezoelectric stack. The first contact extends through the first piezoelectric layer and is electrically coupled to the first electrode. The first contact is surrounded by the electrode pad between the first and second piezoelectric layers. The second contact extends through the second piezoelectric layer and is electrically coupled to the second electrode. The method further includes forming a top electrode layer on the second piezo electric stack. The top electrode layer is patterned to form a first top electrode coupled to the first contact and a second top electrode coupled to the second contact.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to piezoelectric Microelectromechanical System (MEMS) structures or devices. The MEMS devices may be designed to be, for example, sensor and resonators. In the case of resonators, they may be used for radio frequency filtering for communication applications. Other types of applications may also be useful for the MEMs devices.

Figure 1:
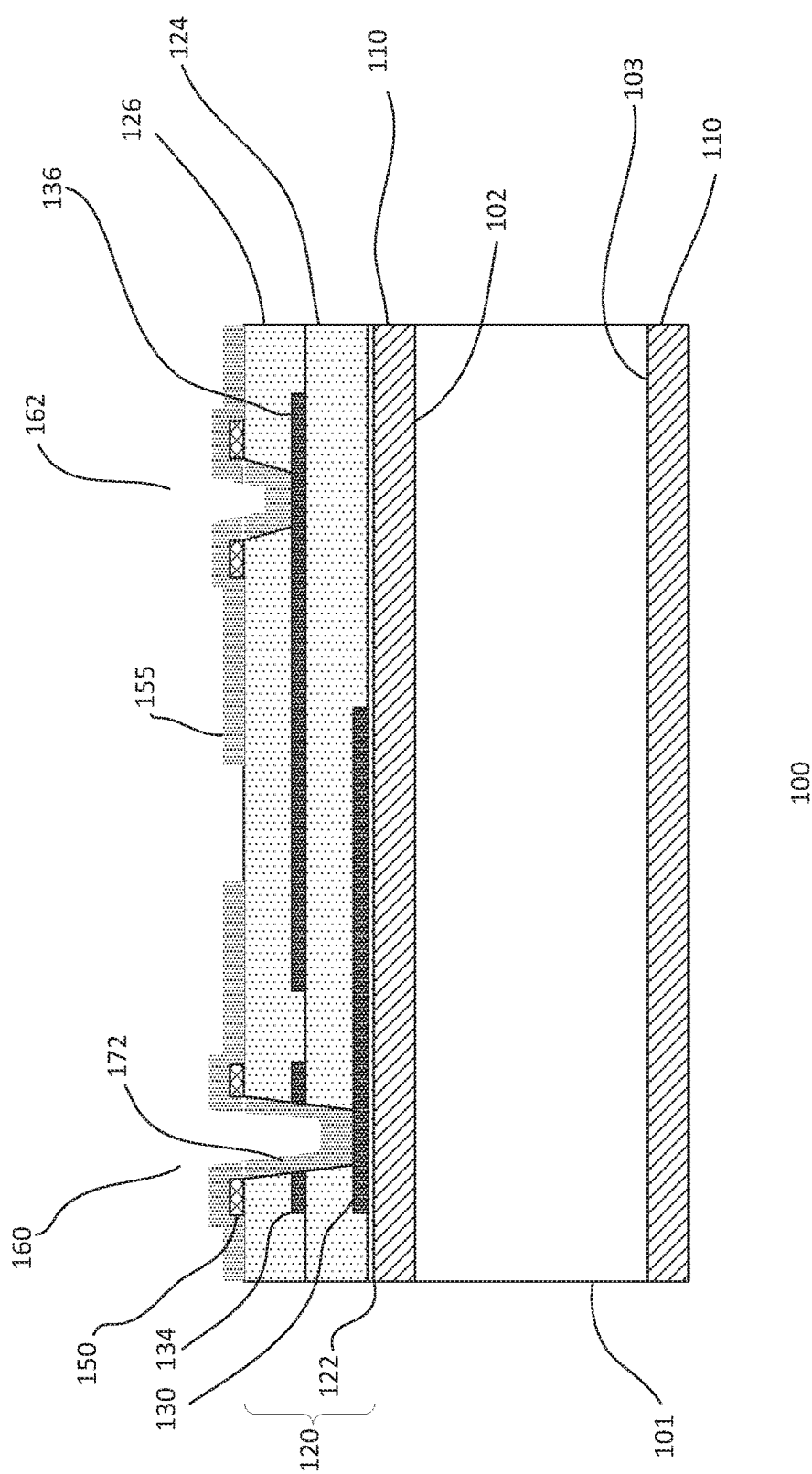
FIG. 1 shows a simplified cross-sectional view of a portion of a Microelectromechanical System (MEMS) device.

FIG. 1 shows a simplified cross-sectional view of a portion of a MEMS device 100. As shown, the device 100 includes a substrate 101. The substrate, for example, is a semiconductor substrate, such as a silicon substrate. Other types of substrates may also be useful. The substrate serves as a base for the MEMS device. The semiconductor substrate, for example, may be a semiconductor wafer which is used to form multiple MEMS devices in parallel. After processing, the wafer is diced to singulate the MEMs devices. In one embodiment, the substrate includes first and second major surfaces 102 and 103. The first major surface, for example, may be referred to as an active or top surface while the second major surface may be referred to as a bottom or inactive surface.

A dielectric layer 110 is disposed on the surface of the substrate. In one embodiment, the dielectric layer is disposed on the first major surface of the substrate. Providing the dielectric layer on both major surfaces of the substrate may also be useful. The dielectric layer may serve as a sacrificial layer. The dielectric layer, for example, may be a silicon oxide layer. Other types of dielectric layers may also be useful. The thickness of the dielectric layer may be about 0.5-5 μm. Other thicknesses for the dielectric layer may also be useful.

In one embodiment, a piezoelectric stack 120 is disposed on the first major surface of the substrate. As shown the piezoelectric stack includes first and second piezoelectric layers 124 and 126. For example, the second piezoelectric layer is disposed above the first piezoelectric layer. Disposed below a piezoelectric layer is a bottom electrode layer. For example, a first bottom electrode layer 130 is disposed below the first piezoelectric layer and a second bottom electrode layer 136 is disposed below the second piezoelectric layer. The electrode layers are, for example, patterned conductive electrode layers. A piezoelectric seed layer 122 may be disposed below the first piezoelectric layer. For example, the seed layer facilitates forming the first piezoelectric layer. The seed layer may be about 20-100 nm thick, an electrode layer may be about 20-200 nm thick, and a piezoelectric layer may be about 100-1000 nm thick. Other thicknesses for the layers may also be useful.

In one embodiment, the piezoelectric layers are aluminum nitride (AlN) layers and the electrode layers are molybdenum (Mo) layers. For example, the piezoelectric stack includes an AlN seed layer with a first AlN layer over a first Mo electrode layer and a second AlN layer over a second Mo electrode layer. Other types of piezoelectric and electrode layers may also be useful to form other types of piezoelectric stacks.

The piezoelectric stack includes contacts which are coupled to the first and second electrode layers. For example, a first contact 160 is electrically coupled to the first bottom electrode layer and a second contact 162 is electrically coupled to the second bottom electrode layer. The piezoelectric layers serve as via levels to the electrode layers. For example, the first piezoelectric layer serves as a first via level (V1) and the second piezoelectric layer serves as a second via level (V2). As shown, the first contact extends through V1 and V2 while the second contact extends through V2.

A contact includes a conductive fill 172. As shown, the contact lines a via opening without filling it. Providing a contact which fills a via opening may also be useful. The via opening may be formed in the piezoelectric stack using a patterned hard mask layer 150. For example, the patterned hard mask is used in an etch process to form the via opening. In one embodiment, the contact is an aluminum copper (AlCu) layer having a thickness of about 20-2000 nm. Other types of contact materials or thicknesses may also be useful. As for the conductive fill, it may be copper. Other types of conductive fills or thicknesses may also be useful. As shown, the fill is patterned along with the hard mask layer. This removes the hard mask layer, leaving a portion beneath the fill which is on the surface of the piezoelectric stack surrounding the contact.

A conductive top electrode layer 155 is disposed over the top of the piezoelectric stack. The top electrode layer, in one embodiment, is an AlCu layer having a thickness of about 20-200 nm. Other types of electrode layers or thicknesses may also be useful. The top electrode layer is a patterned top electrode layer. For example, the top electrode layer is patterned to include first and second top electrodes which are respectively coupled to first and second contacts.

As described, a contact may extend through multiple piezoelectric or via levels of the stack. For example, the first contact which is coupled to the first bottom electrode layer extends through the first and second piezoelectric layers or V1 and V2. In one embodiment, when a contact extends through multiple piezoelectric layer, it passes through an inactive portion of an electrode layer disposed between two adjacent piezoelectric layers. The inactive portion of an electrode layer, for example, may be referred to as an electrode pad 134.

The electrode pad facilitates an etch which forms via openings for contacts of different piezoelectric levels using a single mask. Furthermore, the electrode pad protects interface of piezoelectric layers from being attacked by the etch process which forms the via openings passing through multiple piezoelectric layers. This prevents formation of nicks on sidewalls of the via at the interface of piezoelectric layers. This is because interface of multiple piezoelectric layers is avoided in via openings with the use of an electrode pad.

As described, the piezoelectric stack includes first and second piezoelectric layers. Providing a piezoelectric stack having more piezoelectric layers may also be useful. It is further understood that only a portion of the MEMS device is shown. A MEMS device may include other structures as well.

The device may include other elements which are not shown. For example, the device may include a cavity at the wafer backside to suspend the piezoelectric film. Providing other elements for the device may also be useful.

FIGS. 2a-2r show simplified cross-sectional views of an embodiment of a process forming a portion of a MEMS device 200. The MEMS device is similar to that described in FIG. 1. As such, common elements may not be described or described in detail.

Referring to FIG. 2a, a substrate 101 is provided. The substrate serves as a base for the MEMS device. The substrate, for example, is a semiconductor substrate, such as a silicon substrate. Other types of substrates may also be useful. The substrate includes first and second major surfaces 102 and 103. The first major surface, for example, may be referred to as an active or top surface while the second major surface may be referred to as a bottom or inactive surface.

Figure 2B:
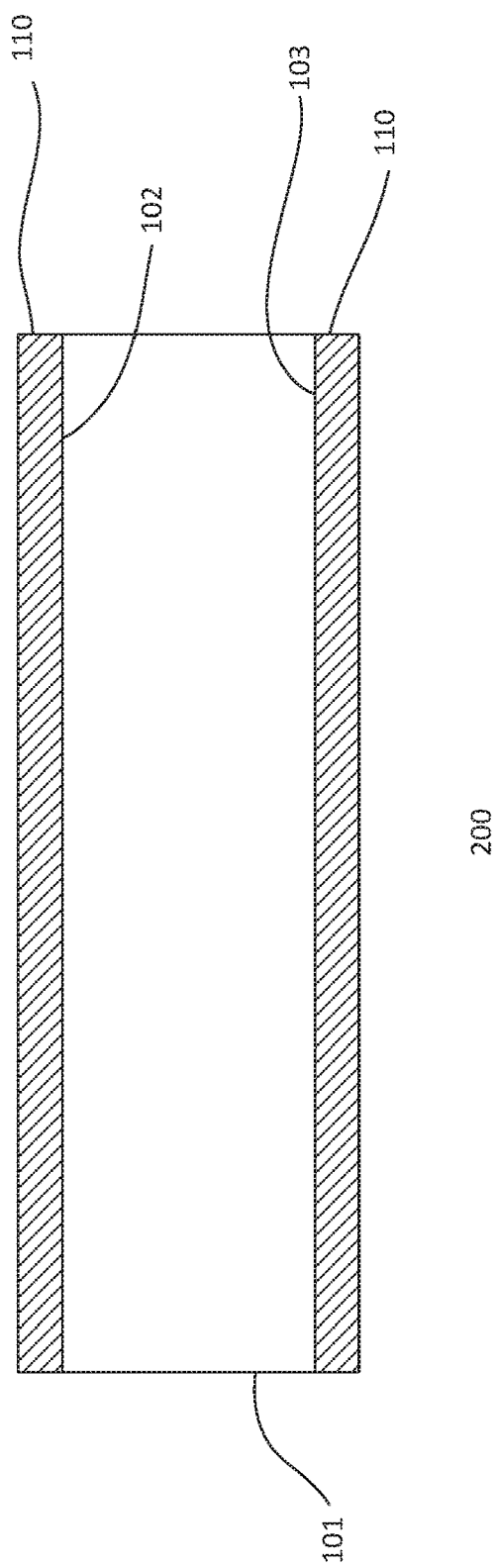
FIGS. 2a-2r show cross-sectional views of an embodiment of a process for forming the MEMS device.

In FIG. 2b, a dielectric layer 110 is formed on the substrate. In one embodiment, the dielectric layer is formed by thermal oxidation. The thermal oxidation oxidizes the surfaces of the substrate. For example, the thermal oxidation forms the dielectric layer on the first and second major surfaces of the substrate as well as the edges (not shown). In another embodiment, the dielectric layer may be formed by plasma enhanced chemical vapor deposition (PECVD) on the surface of the substrate. In the case of PECVD, the dielectric layer may be formed on the first major surface. The dielectric layer may be silicon oxide. For example, the dielectric layer may be a thermally formed or deposited silicon oxide. Other types of dielectric layers may also be useful. The dielectric layer, for example, may be about 0.5-5 um thick. Forming dielectric layers of other thicknesses may also be useful.

Referring to FIG. 2c, the process of forming a multi-layered piezoelectric stack commences. As shown, a piezoelectric seed layer 122 is formed on the dielectric layer which is over the first major surface of the substrate. The seed layer, for example, is an AlN seed layer to facilitate forming an AlN piezoelectric layer. The seed layer may be formed by, for example, physical vapor deposition (PVD). Other techniques for forming the seed layer may also be useful. The seed layer may have a thickness of about 20-100 nm. Forming a seed layer having other thicknesses may also be useful.

Figure 2D:
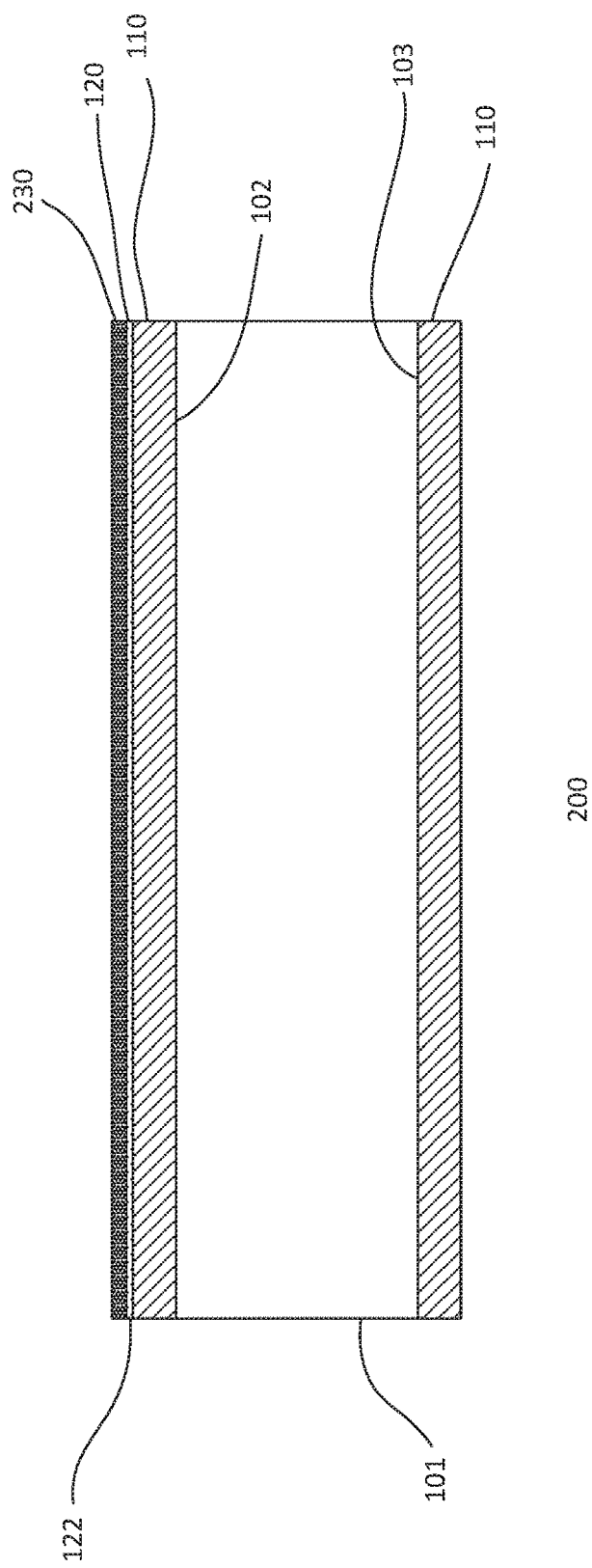

In FIG. 2d, a first electrode layer 230 is formed on the substrate. For example, the first electrode layer is formed over the seed layer. The electrode layer is a conductive electrode layer. In one embodiment, the electrode layer is a Mo layer. Other types of electrode layers may also be useful. The Mo layer may be formed by PVD. The thickness of the electrode layer may be about 20-200 nm. Forming other types of electrode layers using other techniques or having other thicknesses may also be useful.

Figure 2E:
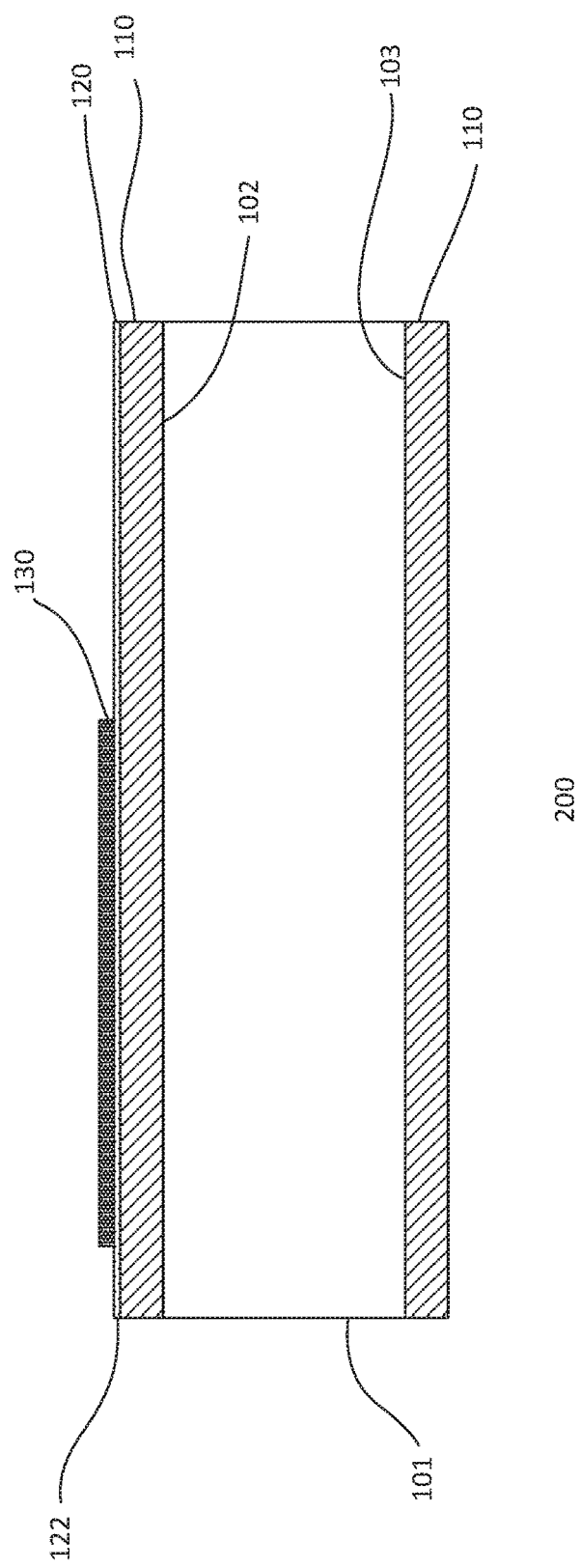

Referring to FIG. 2e, the electrode layer is patterned to form a patterned first bottom electrode layer 130 over the seed layer 122. To pattern the electrode layer 230, mask and etch techniques may be used. For example, a photoresist mask may be formed on the electrode layer. The photoresist mask may be exposed using photolithographic techniques. For example, an exposure source exposes the photoresist layer with a reticle having a desired pattern. The pattern of the reticle is transferred to the photoresist after development. For example, the mask includes openings to expose portions of the electrode layer. An etch removes exposed portions of the electrode layer to form the patterned first bottom electrode layer 130. The etch, for example, may be an isotropic etch, such as a wet etch. Other types of etch processes, such as a reactive ion etch (RIE), may also be useful. The photoresist layer may be removed after patterning the electrode layer by, for example, ashing. Other techniques for removing the resist mask may also be useful.

The process continues by forming a piezoelectric layer 124 on the substrate, as shown in FIG. 2f. For example, a first piezoelectric layer of the piezoelectric stack is formed over the seed layer and patterned bottom electrode layer. In one embodiment, the piezoelectric layer is an AlN layer. The first AlN layer may be formed by PVD and has a thickness of about 100-1000 nm. Forming other types of piezoelectric layer using other techniques or having other thicknesses may also be useful.

Figure 2G:
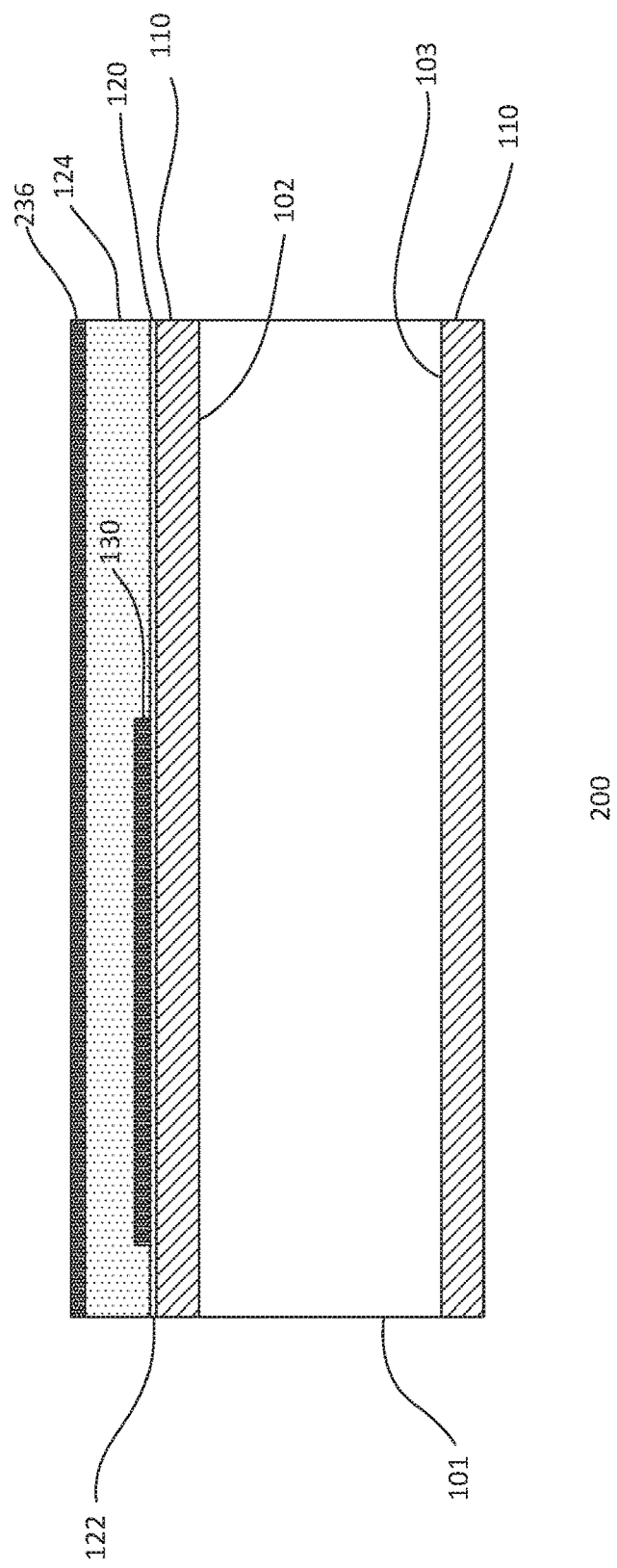

In FIG. 2g, an electrode layer 236 is formed on the substrate. For example, a second electrode layer is formed over the first piezoelectric layer. The electrode layer, for example, is a Mo layer. Other types of electrode layers may also be useful. The Mo layer may be formed by PVD and has a thickness about 20-200 nm. Forming other types of electrode layers using other techniques or having other thicknesses may also be useful.

Figure 2H:
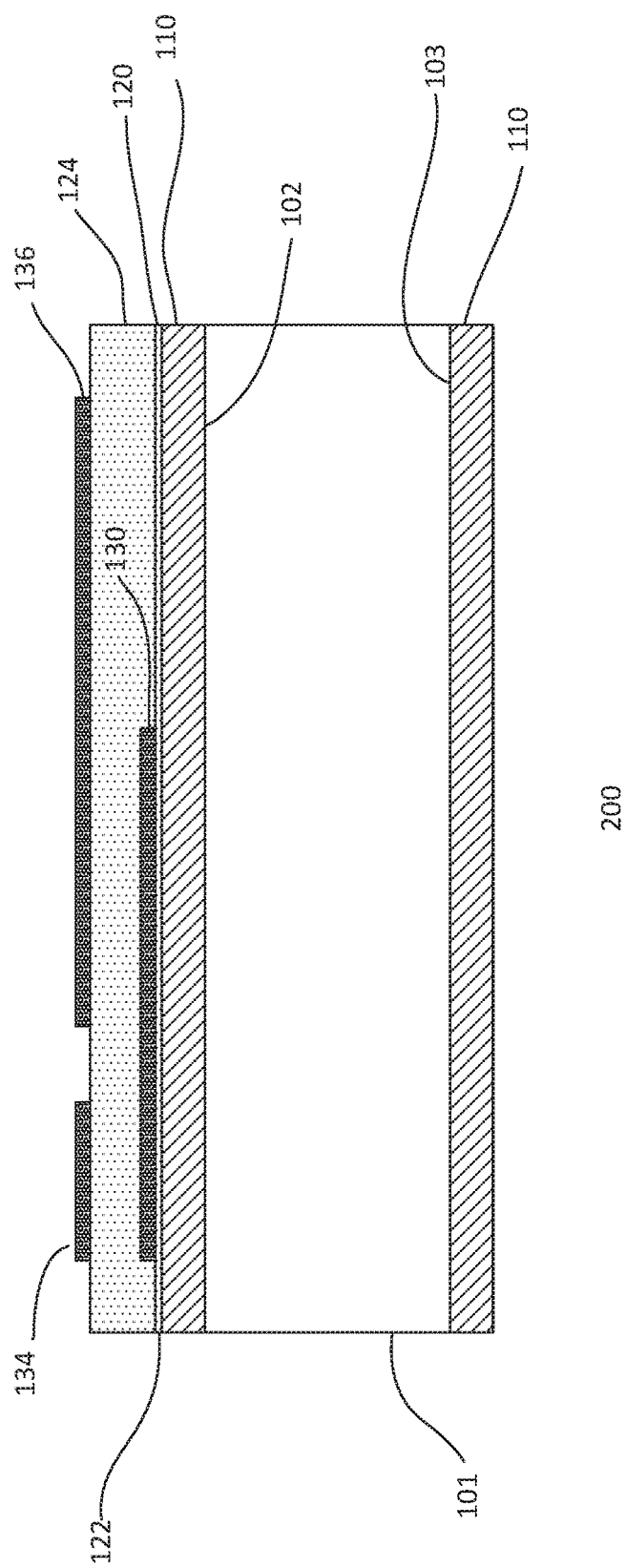

The second electrode layer, as shown in FIG. 2h, is patterned to form a patterned second bottom electrode layer 136 over the first piezoelectric layer. Mask and etch techniques may be used to pattern the electrode layer. In one embodiment, the second bottom electrode layer includes an electrode pad 134. The photoresist layer may be removed after patterning the electrode layer by, for example, ashing. Other techniques for removing the resist mask may also be useful.

Figure 2I:
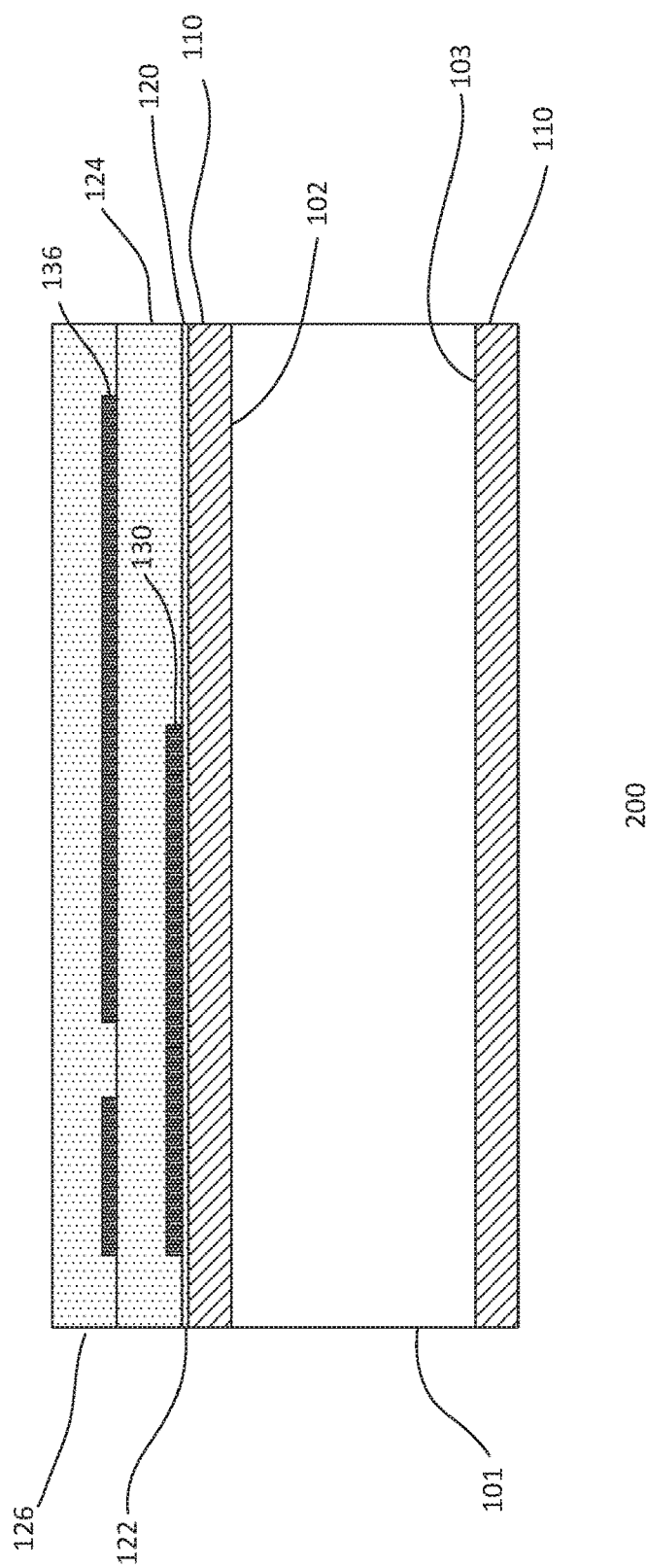

Referring to FIG. 2i, a second piezoelectric layer 126 of the stack is formed over the patterned second bottom electrode layer. For example, a second AlN layer is formed by PVD over the first AlN and patterned second bottom electrode layer. The AlN layer, for example, may be about 100-1000 nm thick. Forming other types of piezoelectric layer using other techniques or having other thicknesses may also be useful. As shown, the piezoelectric stack includes first (124) and second (126) piezoelectric layers with patterned first (130) and second (136) bottom electrode layers. Providing a multi-piezoelectric stack with other number of piezoelectric layers may also be useful.

Figure 2J:
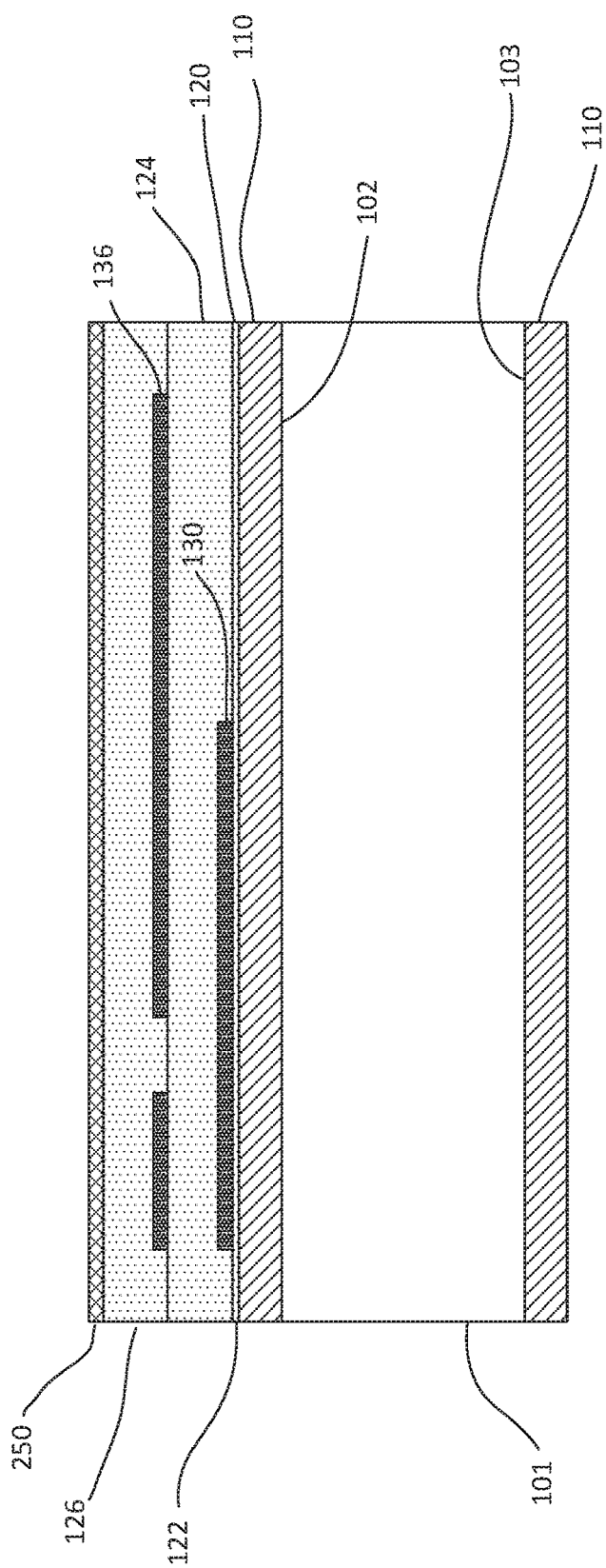

The process continues to form contacts in the multi-piezoelectric stack. In one embodiment, as shown in FIG. 2j, a hard mask 250 is formed over the stack. For example, the hard mask is formed on the second piezoelectric layer. The hard mask may be a tetraethyl orthosilicate (TEOS) hard mask. Other types of hard masks may also be useful. The hard mask, for example, may be a Ti/TiN hard mask. Various techniques, such as chemical vapor deposition (CVD), PVD or sputtering may be used to form the hard mask. The hard mask may have a thickness of about 20-100 nm. Other thicknesses may also be useful.

Figure 2K:
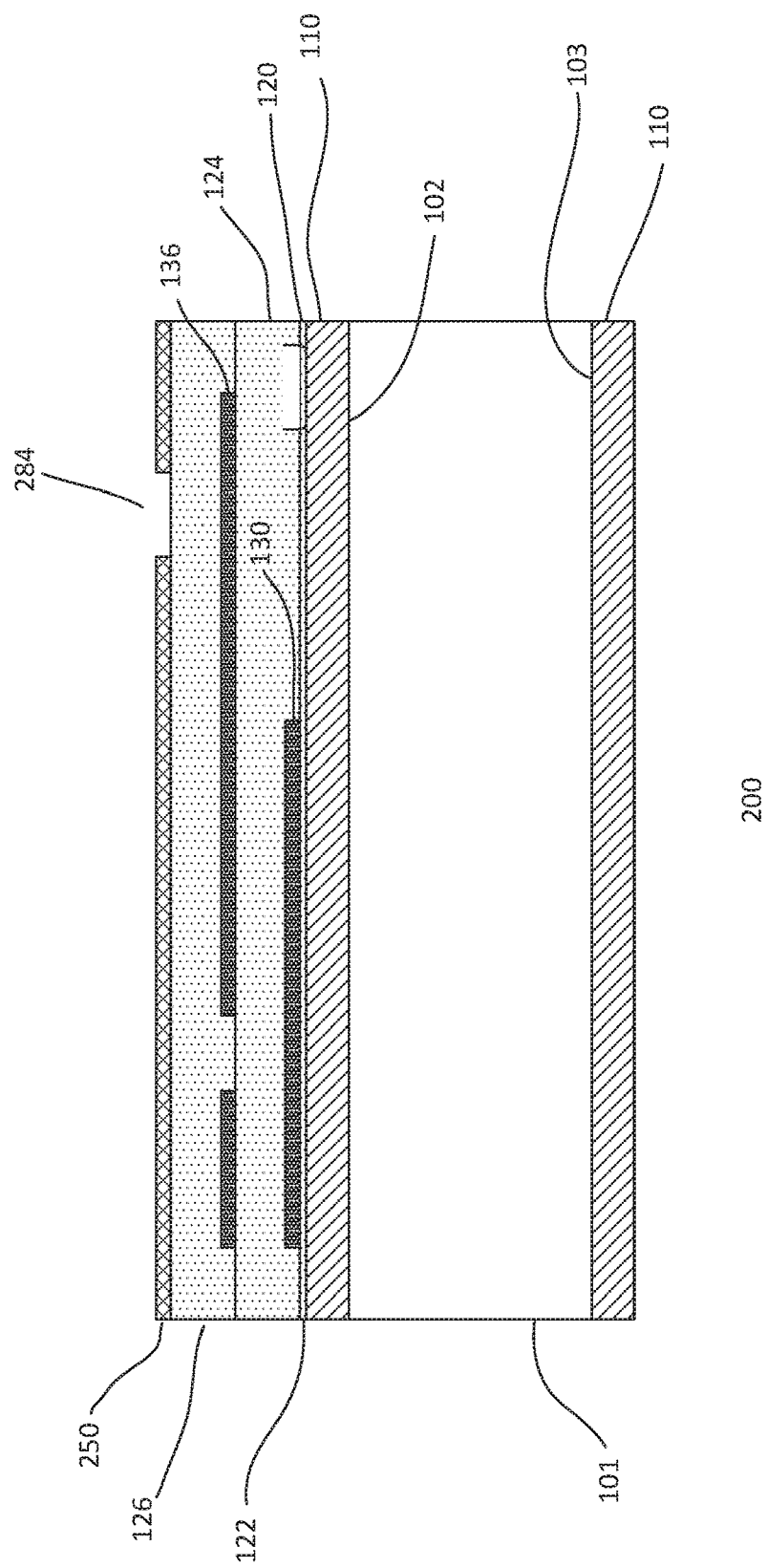
Figure 21:
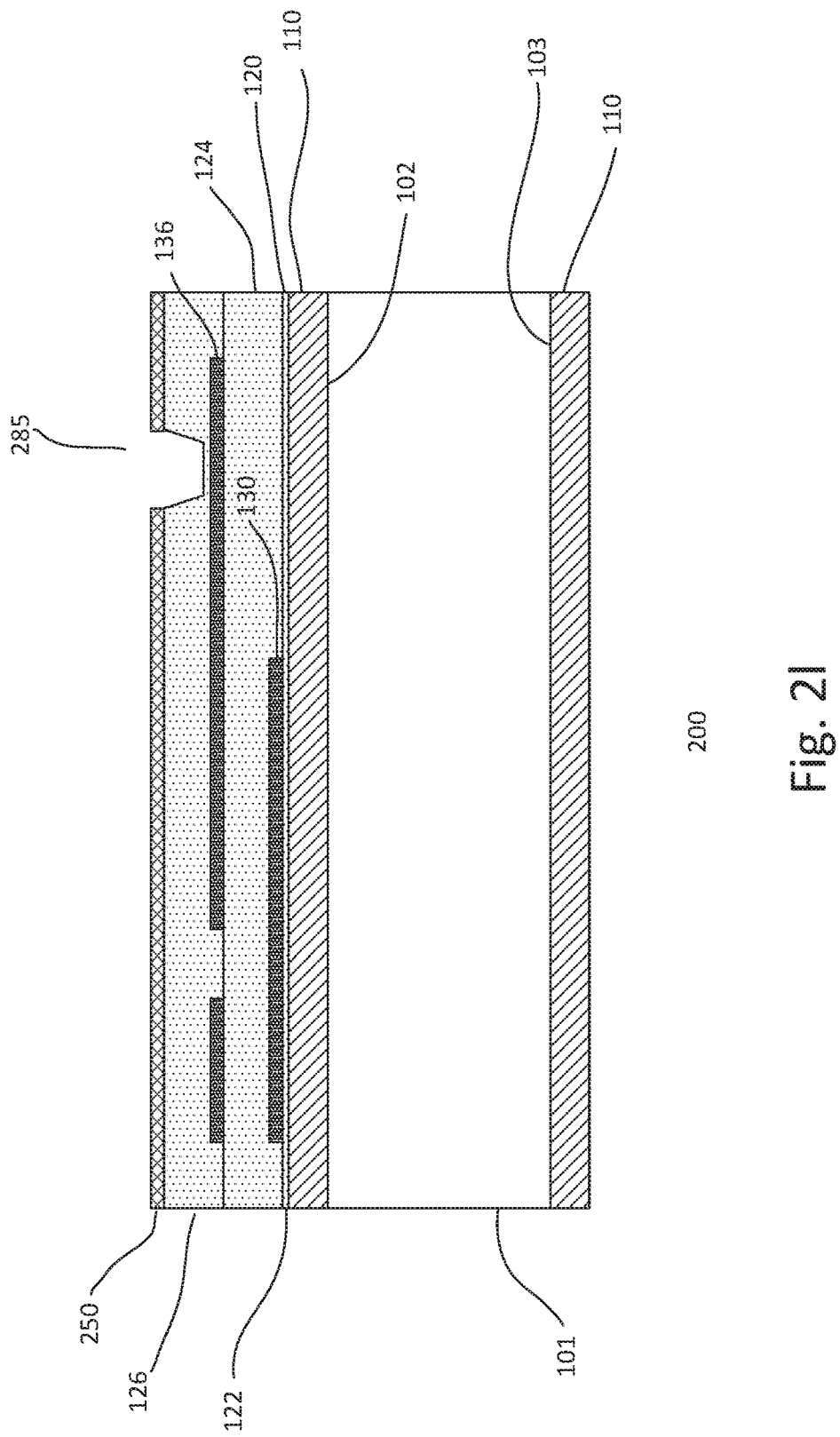

Referring to FIG. 2k, an opening 284 is formed in the hard mask. The opening may be formed using mask and etch techniques. For example, a patterned photoresist is used to etch the hard mask layer 250. The etch, for example, is a reactive ion (RIE) etch. The opening corresponds to where a contact via is to be formed in the piezoelectric stack. In one embodiment, the contact via is a via which extends to the upper level of the piezoelectric stack. For example, the contact via is a second via of the second contact which extends through to V2 or the second piezoelectric layer of the stack. The photoresist layer may be removed after forming the opening by, for example, ashing. Other techniques for removing the resist mask may also be useful.

In FIG. 2l, the piezoelectric layer is etch using the patterned hard mask to form a via 285. In one embodiment, the etch forms a partial via in the second piezoelectric layer 126 of V2 of the stack. The etch, in one embodiment, is a dry etch. For example, a RIE using $Cl_2$ based chemistry may be used. The partial via, for example, has about 20-200 nm remaining before exposing the patterned bottom electrode layer below the second piezoelectric layer. Leaving other amounts of piezoelectric layer below partial via opening may also be useful.

Figure 2M:
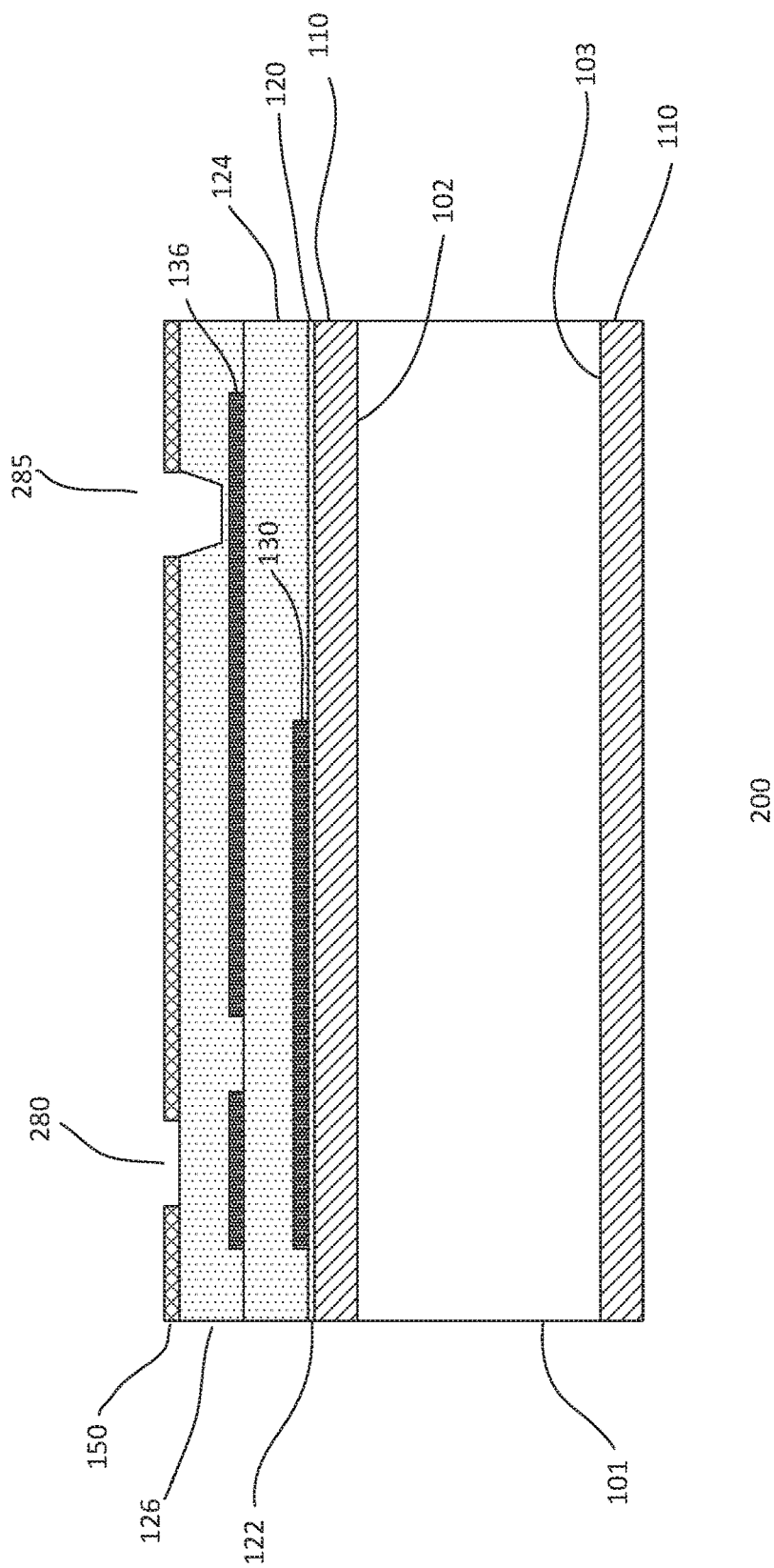

As shown in FIG. 2m, another opening 280 is formed in the hard mask layer. The opening may be formed similarly as the opening 285. The opening corresponds to where a contact via is to be formed in the piezoelectric stack. In one embodiment, the contact via is a via which extends beyond the second via. For example, the contact via is a first via of the first contact which extends through V2 and V1 to the first bottom electrode 130.

Figure 2N:
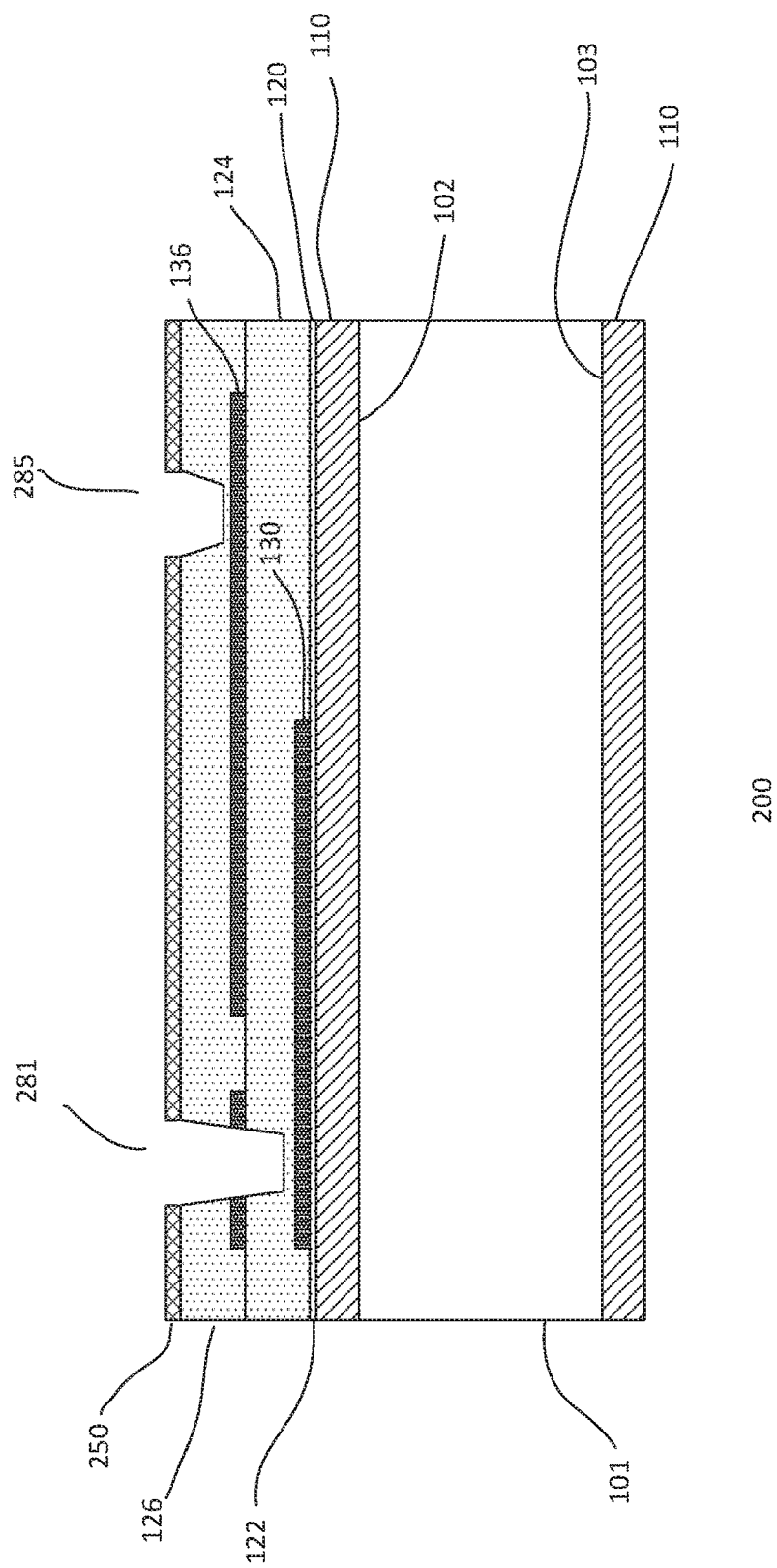
Figure 20:
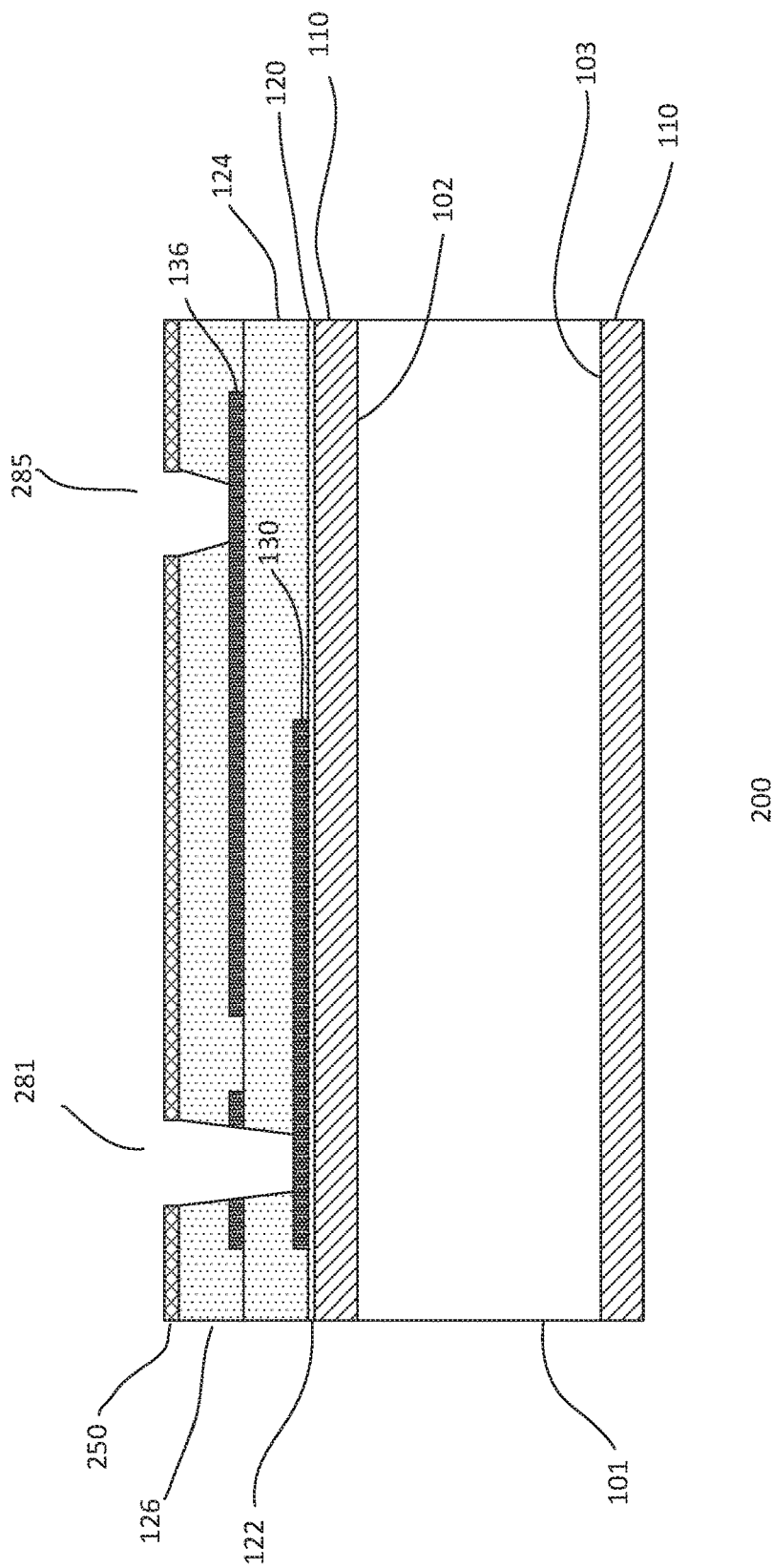

The piezoelectric stack 120 is patterned using the hard mask, as shown in FIG. 2n. For example, the piezoelectric stack is patterned to form a partial via through V2 and V1 of the piezoelectric stack. As discussed, electrode pad or pads are disposed in the upper electrode layers. For example, an electrode pad of the second bottom electrode layer is disposed in between the first and second piezoelectric layers of the stack. The electrode pad prevents existence of a piezoelectric interface between two piezoelectric layers.

The etch etches the second piezoelectric layer, electrode pad and the first piezoelectric layer to form the second partial via. In one embodiment, the etch is a dry etch. The etch, for example, is the same or similar to the etch that forms the second partial via. The second partial via, for example, has about 20-200 nm remaining before exposing the first patterned bottom electrode layer below the second piezoelectric layer. Leaving other amounts of piezoelectric layer below the partial via opening may also be useful.

Preferably, the amount remaining is about the same as that of the first partial via. The photoresist layer may be removed after forming the second partial via by, for example, ashing. Other techniques for removing the resist mask may also be useful. The contact openings may be about 1-10 um. Other sized contact openings may also be useful.

Referring to FIG. 2o, an etch removes remaining portions of the piezoelectric layer to expose the electrode layers. For example, the etch removes remaining portions of the piezoelectric layer in the partial first and second vias, exposing the first and second bottom electrode layers. In one embodiment, the etch is a wet etch. The wet etch, for example, is a wet etch using tetramethylammonium hydroxide (TMAH). The wet etch has increased selectivity between the piezoelectric layer and electrode layers. This ensures that remaining piezoelectric materials are removed without penetrating through the bottom electrode layer. Furthermore, due to the electrode pad layer, damage to the piezoelectric interface is avoided since no piezoelectric interfaces exist.

Figure 2P:
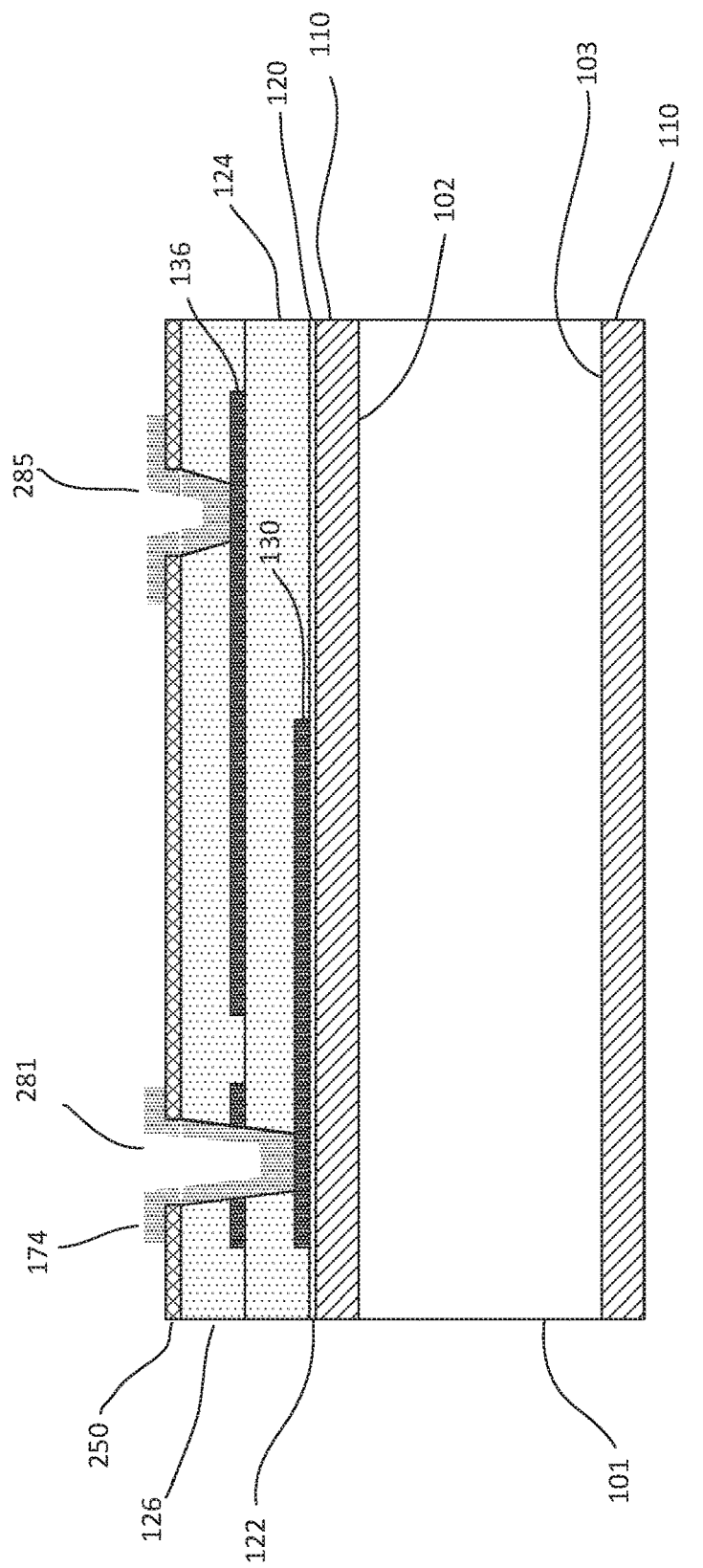

Referring to FIG. 2p, a conductive layer is formed on the substrate (not shown). The conductive layer, for example, covers the surface of the hard mask and lines the vias. In one embodiment, the conductive layer serves as a fill layer for the vias to form the contacts. As shown, the conductive layer lines the vias without filling them. Providing a fill layer filling the vias may also be useful. In one embodiment, the conductive layer is an AlCu layer having a thickness of about 20-200 nm. Other types of conductive layers or thicknesses may also be useful. The conductive layer may be formed by PVD. Other techniques may also be used to form the conductive layer.

The contact fill layer is patterned. Mask and etch techniques may be used to pattern the contact fill layer. For example, a patterned resist mask may be used as an etch mask for an etch to pattern the contact fill layer. The etch, for example, may be a wet etch or a dry etch. Patterning the contact fill layer leaves a portion remaining on the hard mask surrounding the vias to form contacts 174.

Figure 2Q:
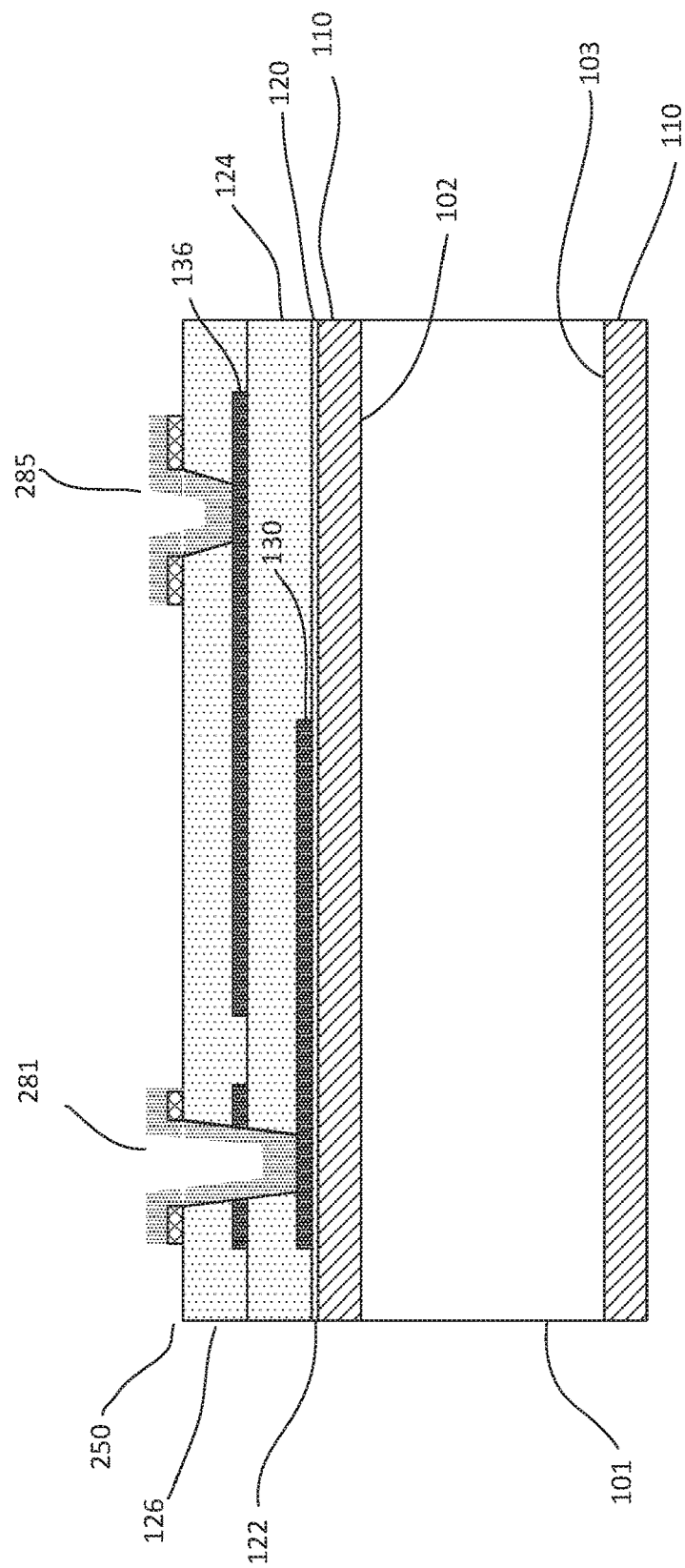

Referring to FIG. 2q, exposed portions of the hard mask 250 are removed, exposing the top of the piezoelectric stack 120. The removal of the hard mask, for example, may use the same etch mask used to pattern the contact fill layer. The hard mask may be removed by, for example, an etch, such as RIE. The use of a wet etch may also be useful.

As shown in FIG. 2r, a conductive layer is formed on the substrate. For example, the conductive layer covers the surface of the piezoelectric stack and lines the contact fill layer in the vias. In one embodiment, the conductive layer serves as a top electrode layer. In one embodiment, the conductive layer is an AlCu layer having a thickness of about 20-200 nm. Other types of conductive layers or thicknesses may also be useful. The conductive layer may be formed by PVD. Other techniques may also be used to form the conductive layer. The top electrode layer is patterned using mask and etch techniques to form top electrodes 155 coupling to the contacts. For example, a first top electrode is coupled to the first contact and a second top electrode is coupled to a second contact.

The process may continue to form other elements of the device. For example, the process may continue to form a cavity on the backside of the substrate to suspend the piezoelectric film. Other processes may also be performed to complete the device.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a device comprising:
    forming a dielectric layer on a substrate;
    forming a piezoelectric stack on the dielectric layer, wherein the piezoelectric stack includes a first bottom electrode, a first piezoelectric layer on the first bottom electrode, a second bottom electrode on the first piezoelectric layer, an electrode pad on the first piezoelectric layer, and a second piezoelectric layer on the first piezoelectric layer, the second bottom electrode, and the electrode pad;
    patterning the second piezoelectric layer, the electrode pad, and the first piezoelectric layer to form a first via over the first bottom electrode that extends fully through the second piezoelectric layer and the electrode pad and partially through the first piezoelectric layer;
    patterning the second piezoelectric layer to form a second via over the second bottom electrode that extends partially through the second piezoelectric layer;
    extending, with an etching process, the first via fully through the first piezoelectric layer to the first bottom electrode and the second via fully through the second piezoelectric layer to the second bottom electrode;
    forming a first contact in the first via that is electrically coupled to the first bottom electrode, and
    forming a second contact in the second via that is electrically coupled to the second bottom electrode.

2. The method of claim 1 further comprising:
    forming a top electrode layer on the second piezoelectric layer; and
    patterning the top electrode layer to form a first top electrode coupled to the first contact and a second top electrode coupled to the second contact.

3. The method of claim 2 wherein the first top electrode and the second top electrode comprise aluminum copper (AlCu).

4. The method of claim 1 wherein the first bottom electrode and the second bottom electrode comprise molybdenum (Mo).

5. The method of claim 1 wherein the first piezoelectric layer and the second piezoelectric layer comprise aluminum nitride (AlN).

6. The method of claim 1 wherein the etching process is a wet etch.

7. The method of claim 6 wherein the wet etch comprises a tetramethylammonium hydroxide (TMAH) wet etch.

8. The method of claim 1 further comprising:
    forming a cavity on a rear side of the substrate to suspend the piezoelectric stack.

9. The method of claim 1 wherein the first via is formed by a first dry etch.

10. The method of claim 9 wherein the second via is formed by a second dry etch after forming the first via.

11. The method of claim 10 wherein the etching process is a wet etch.

12. The method of claim 11 wherein the wet etch comprises a tetramethylammonium hydroxide (TMAH) wet etch.

13. The method of claim 1 wherein the second via is formed by a dry etch.

14. The method of claim 1 wherein the first via and the first contact in the first via are surrounded by the electrode pad.

\* \* \* \* \*